US012666611B2

(12) United States Patent
Peng

(10) Patent No.: US 12,666,611 B2
(45) Date of Patent: Jun. 23, 2026

(54) METHOD FOR MANUFACTURING HIGH-DENSITY THREE-DIMENSIONAL PROGRAMMABLE MEMORY

(71) Applicant: CHENGDU PBM TECHNOLOGY LTD., Chengdu (CN)

(72) Inventor: Jack Zezhong Peng, Chengdu (CN)

(73) Assignee: CHENGDU PBM TECHNOLOGY LTD., Chengdu (CN)

( * ) Notice: Subject to any disclaimer, the term of this patent is extended or adjusted under 35 U.S.C. 154(b) by 678 days.

(21) Appl. No.: 17/802,072

(22) PCT Filed: Mar. 10, 2021

(86) PCT No.: PCT/CN2021/079887
§ 371 (c)(1),
(2) Date: Aug. 24, 2022

(87) PCT Pub. No.: WO2021/203897
PCT Pub. Date: Oct. 14, 2021

(65) Prior Publication Data
US 2023/0069448 A1      Mar. 2, 2023

(30) Foreign Application Priority Data

Apr. 8, 2020    (CN) .......................... 202010270774.1

(51) Int. Cl.
*H01L 27/112*      (2006.01)
*H10B 20/20*      (2023.01)
*H10W 20/49*      (2026.01)

(52) U.S. Cl.
CPC .......... *H10B 20/20* (2023.02); *H10W 20/491* (2026.01)

(58) Field of Classification Search
CPC ........ H10B 20/20; H10B 61/00; H10B 63/00; H10B 20/25; H10W 20/491; H01L 23/5252; H10N 70/066
See application file for complete search history.

(56) References Cited

U.S. PATENT DOCUMENTS 8,436,414 B2 *   5/2013   Tanaka ................... H10D 30/69
                                                                     257/324
8,787,094 B2 *   7/2014   Costa ................... G11C 16/344
                                                                     365/185.17

(Continued)

FOREIGN PATENT DOCUMENTS

CN        109545787 A      3/2019
CN        109686703 A      4/2019

(Continued)

OTHER PUBLICATIONS

International Search Report, PCT/CN2021/079887, Jun. 9, 2021, 4 pages.

*Primary Examiner* — Jay C Kim

(57)         ABSTRACT

A method for manufacturing a high-density three-dimensional programmable memory, relating to the memory manufacturing technology, comprises the following steps: 1) forming a base structure; 2) grooving the base structure; 3) disposing, storage medium layers required by a preset memory structure layer by layer on an inner wall of the division groove; 4) filling a core medium in the division groove to form a core medium layer; 5) etching, through a mask etching process, to form deep holes along the separation division groove filled with the core where the deep holes truncate the core medium in the division groove; and 6) filling an insulation medium in the deep holes. The method has the beneficial effects of low costs and the highest storage density.

9 Claims, 8 Drawing Sheets

| Conductive medium layer (in base structure) |
|---|
| First medium |
| Second medium |
| Core medium |
| Second medium |
| First medium |
| Conductive medium layer (in base structure) |

(56)     References Cited

U.S. PATENT DOCUMENTS

| | | | | |
|---|---|---|---|---|
| 8,873,293 | B1 * | 10/2014 | Ou | G11C 16/0483 |
| | | | | 365/185.17 |
| 8,916,919 | B2 * | 12/2014 | Thompson | H10W 20/496 |
| | | | | 257/532 |
| 8,929,141 | B1 * | 1/2015 | Raghu | G11C 16/0483 |
| | | | | 365/185.13 |
| 8,956,968 | B2 * | 2/2015 | Higashitani | H10B 43/40 |
| | | | | 438/630 |
| 9,343,159 | B2 * | 5/2016 | Dong | G11C 16/3418 |
| 9,524,980 | B2 * | 12/2016 | Lue | H01L 23/528 |
| 9,698,156 | B2 * | 7/2017 | Lue | H10B 43/10 |
| 10,340,222 | B2 * | 7/2019 | Hu | H10B 43/30 |
| 10,403,719 | B2 * | 9/2019 | Choi | H10B 43/35 |
| 10,644,024 | B2 * | 5/2020 | Wang | H10B 43/10 |
| 10,950,622 | B2 * | 3/2021 | Kondo | H10B 43/27 |
| 10,985,171 | B2 * | 4/2021 | Kaneko | H10B 43/10 |
| 11,222,900 | B2 * | 1/2022 | Shimojo | H10B 43/35 |
| 11,309,329 | B2 * | 4/2022 | Borukhov | H10B 43/27 |
| 11,398,426 | B2 * | 7/2022 | Datta | H10W 20/496 |
| 11,581,337 | B2 * | 2/2023 | Wang | H10D 64/258 |
| 2009/0321878 | A1 | 12/2009 | Koo et al. | |
| 2020/0044013 | A1 * | 2/2020 | Lu | H10D 1/042 |

FOREIGN PATENT DOCUMENTS

| | | | | | |
|---|---|---|---|---|---|
| CN | 109687703 | * | 4/2019 | | H10B 99/00 |
| CN | 109687703 A | * | 4/2019 | | H10B 99/00 |
| CN | 109887923 | * | 6/2019 | | H10B 43/20 |
| CN | 109887923 A | * | 6/2019 | | H10B 43/20 |
| CN | 111192304 A | | 5/2020 | | |
| CN | 108140644 B | | 3/2022 | | |

* cited by examiner

41

42

43

44

A

A'

A

A'

A

A'

| Conductive medium layer (in base structure) |
|:---:|

| First medium |
|:---:|
| Second medium |
| Core medium |
| Second medium |
| First medium |

| Conductive medium layer (in base structure) |
|:---:|

METHOD FOR MANUFACTURING HIGH-DENSITY THREE-DIMENSIONAL PROGRAMMABLE MEMORY

CROSS REFERENCE TO RELATED APPLICATION

This patent application is a U.S. National Stage Application under 35 U.S.C. 371 of PCT Application No. PCT/CN2021/079887, filed Mar. 10, 2021, which claims the benefit and priority of Chinese Patent Application No. 202010270774.1, filed Apr. 8, 2020, entitled "METHOD FOR MANUFACTURING HIGH-DENSITY THREE-DIMENSIONAL PROGRAMMABLE MEMORY", the disclosure of which is incorporated by reference herein.

TECHNICAL FIELD

The present disclosure relates to memory manufacturing technologies.

BACKGROUND ART

The conventional technologies include various digital storage technologies such as an erasable programmable read only memory (EPROM), an electrically erasable programmable read only memory (EEPROM), a flash memory, a NAND-flash memory, a hard disk, a compact disk (CD), a digital versatile disk (DVD), and a Blu-ray disc registered by the Blu-ray Disc Association, which have been widely used for data storage for more than 50 years. However, the service life of storage media is usually less than 5 to 10 years. The current anti-fuse storage technology developed for big data storage cannot meet the requirement of mass data storage because of high costs and low storage density.

Chinese patent application No. 201811117240.4 discloses a method for manufacturing a three-dimensional programmable memory. The method includes:

1) forming a base structure: a predetermined number of conductive medium layers and a predetermined number of insulating medium layers are disposed in such a manner that the conductive medium layers and the insulating medium layers are alternately stacked on each other, to form the base structure;

2) grooving the base structure: at least three parallel strip-shaped grooves penetrating from a top layer to a bottom layer are formed on the base structure, and the strip-shaped grooves are independent of each other, and the adjacent sides of two adjacent strip-shaped grooves are long sides of the strip-shaped grooves;

3) disposing storage medium layers required for a preset memory structure, on an inner wall of each strip-shaped groove layer by layer;

4) filling a core material in a cavity of each strip-shaped groove to form a core medium layer;

5) disposing isolation grooves penetrating from the top layer to the bottom layer in the end region of the strip-shaped grooves, where in terms of shape, each isolation groove connects the head or tail of a strip-shaped groove to the head or tail of another strip-shaped groove so to form one curve, and the isolation grooves intrude into the strip-shaped grooves so that conductive materials at two ends of a long side of the strip-shaped groove are insulated by the isolation grooves; and forming cutting slots that penetrate from the top layer to the bottom layer on the strip-shaped groove, where the cutting slots intrude into the base structure medium by the long sides of the strip-shaped groove on which the cutting slots are, and the cutting slots divide the strip-shaped groove into at least three independent memory units; and 6) filling an insulating material in the isolation grooves and the cutting slots.

In this method, several independent strip-shaped grooves are first formed in step 2). After the storage medium is deposited on the inner wall of the groove which is then filled with the core material, the isolation groove connects the independent strip-shaped grooves to form a curve. This method has the following shortcomings: because the base structure is formed by conductive medium layers and insulating medium layers that are alternately stacked on each other, in some process environments, a material used for etching the conductive medium layer and a material used for etching the insulating medium layer may be different, which results in repeatedly replacing different etching materials, that is, costs of etching the stacked structure are relatively high. This method implements etching of the stacked structure in step 2) and implements etching of the stacked structure again in step 5), which is not economical in terms of cost. Further, excessively cumbersome processes may reduce not only production efficiency, but also yields.

Similarly, Chinese patent application No. 201910136928.1 discloses a non-volatile storage device and a manufacturing method thereof, which also have the problems of complicated processes and low yields.

SUMMARY

To solve the foregoing technical problem, the present disclosure provides a method for manufacturing a high-density three-dimensional programmable memory, which is characterized by low costs and high yields.

To solve the foregoing technical problem, the present disclosure adopts the technical solution of a method for manufacturing a high-density three-dimensional programmable memory, including:

step 1: forming a base structure, where disposing the predetermined number of conductive medium layers and the predetermined number of insulating medium layers are disposed in such a manner that the conductive medium layers and the insulating medium layers are alternately stacked on each other, to form the base structure;

step 2: grooving the base structure, where the base structure is grooved to form a curved division groove penetrating from a top layer to a bottom layer on the base structure, so that the division groove divides the base structure into two interdigitated structures that are staggered and separated from each other;

step 3: disposing storage medium layers required by a preset memory structure layer by layer on an inner wall of the division groove;

step 4: filling a core medium in the division groove to form a core medium layer;

step 5: etching, through a mask etching process, to form deep holes along the division groove filled with the core medium, wherein the deep holes truncate the core medium in the division groove, to form a predetermined number of core medium blocks that are distributed along the long-side direction of the division groove and that are independent of each other, and each core medium block is still connected to the two interdigitated structures through the storage medium layer; and

step 6: filling an insulating medium in the deep holes formed by etching in step 5.

Further, in step 3, the preset memory structure may be one of the following structures:

a PN junction semiconductor memory structure, a Schottky semiconductor memory structure, a resistance change memory structure, a magnetic phase change memory structure, a phase change memory structure, and a ferroelectric memory structure.

Further, the preset memory structure may be a PN junction semiconductor memory structure, including a P-type conductive region, an N-type conductive region, and an insulating medium region disposed therebetween.

The conductive medium layer may be a P-type semiconductor, and the core medium layer may be an N-type semiconductor; or the conductive medium layer is an N-type semiconductor, and the core medium layer is a P-type semiconductor.

Step 3 includes: step 3.1: disposing an insulating layer in the division groove.

Further, the preset memory structure may be a Schottky diode memory structure, including a semiconductor conductive region, a metal conductive region, and an insulating medium region disposed therebetween.

The conductive medium layer may be a semiconductor required for forming a Schottky diode structure, and the core medium layer may be metal required for forming the Schottky diode structure; or the conductive medium layer may be metal required for forming the Schottky diode structure, and the core medium layer may be a semiconductor required for forming the Schottky diode structure.

Step 3 includes: step 3.1: disposing an insulating layer in the division groove.

The preset memory structure may be a memory-medium memory structure, and the memory-medium memory may be any one of a resistance change memory structure, a magnetic phase change memory structure, a phase change memory structure, and a ferroelectric memory structure.

Materials of the conductive medium layer and the core medium layer may be both metal or polycrystalline silicon:

Step 3 includes: step 3.1: disposing a memory medium layer in the division groove.

The preset memory structure may be a PN junction semiconductor memory structure, including a P-type conductive region, an N-type conductive region, and an insulating medium region disposed therebetween.

The conductive medium layer may be a P+-type semiconductor, and the core medium layer may be an N+-type semiconductor or conductor.

Step 3 includes:

step 3.1: disposing an insulating layer in the division groove.

step 3.2: disposing a lightly-doped N-type semiconductor layer on an inner wall of the insulating layer; and step 3.3: filling the core medium in a cavity of a strip-shaped groove provided with the insulating layer and the lightly-doped N-type semiconductor layer.

Alternatively, the preset memory structure may be a PN junction semiconductor memory structure, including a P-type conductive region, an N-type conductive region, and an insulating medium region disposed therebetween.

The conductive medium layer may be an N+-type semiconductor or conductor, and the core medium layer may be a P+-type semiconductor.

4

Step 3 includes:

step 3.1: disposing a lightly-doped N-type semiconductor layer in the division groove;

step 3.2: disposing an insulating layer on an inner wall of the lightly-doped N-type semiconductor layer; and step 3.3: filling the core medium in a cavity of the groove provided with the lightly-doped N-type semiconductor layer and the insulating layer.

Alternatively, the preset memory structure may be a Schottky semiconductor memory structure, including a metal conductive region, a semiconductor conductive region, and an insulating medium region disposed therebetween.

Step 3 includes:

step 3.1: disposing an insulating layer in the division groove;

step 3.2: disposing a semiconductor layer on an inner wall of the insulating layer; and step 3.3: filling the core medium in a cavity of the division groove provided with the insulating layer and the conductor layer.

The conductive medium layer may be metal required for a Schottky diode, the semiconductor layer may be a semiconductor required for a Schottky diode, and the core medium layer may be a conductor.

Step 5 includes:

etching, through the mask etching process, to form the deep holes along the division groove filled with the core medium, where the deep holes truncate the core medium in the division groove, to form multiple core medium blocks that are distributed along the long-side direction of the division groove and that are independent of each other, and each core medium block is still connected to the two interdigitated structures through the storage medium layer.

The present disclosure further includes a step of penetrating through the storage layer in a bottom region of the division groove, and the step of penetrating through the storage medium layers in the bottom region of the division groove comprises: after performing step 3, etching each storage medium layer in the bottom region of the division groove until the base structure is penetrated through.

Alternatively, the step of penetrating through the storage medium layer in the bottom region of the division groove may comprise: after performing step 6, applying power to the filled medium and an underlying circuit, to break down each storage medium layer in the bottom region of the division groove.

The division groove includes a group of horizontal rectangular grooves and a group of vertical rectangular grooves. Horizontal rectangular grooves in the horizontal rectangular groove group are parallel to each other, and vertical rectangular grooves in the vertical rectangular groove group are parallel to each other. The horizontal rectangular grooves are perpendicular to the vertical rectangular grooves, and the rectangular grooves are connected to form a complete curved division groove.

The present disclosure has the beneficial effects of high storage density of the manufactured semiconductor memory, low process costs and high yields. The present disclosure completes all required multi-layer etching in one process step of multi-layer etching, which greatly simplifies process procedures, reduces costs, and improves yields.

The present disclosure has the following features:

1. Multiple layers of 2-bit OTP memory cells are directly formed from the isolation of medium in a deep trench groove.

2. Only two deep trench etching and filling processes are required, and cell isolation and isolation of the left and right interdigitated structures are completed in one step.

3. A caliber of a rectangular deep hole cell can achieve the latest size in self-aligned cell isolation process to achieve the highest storage density.

4. The fabrication process is easier to control.

DETAILED DESCRIPTION OF THE EMBODIMENTS

Figure 1:
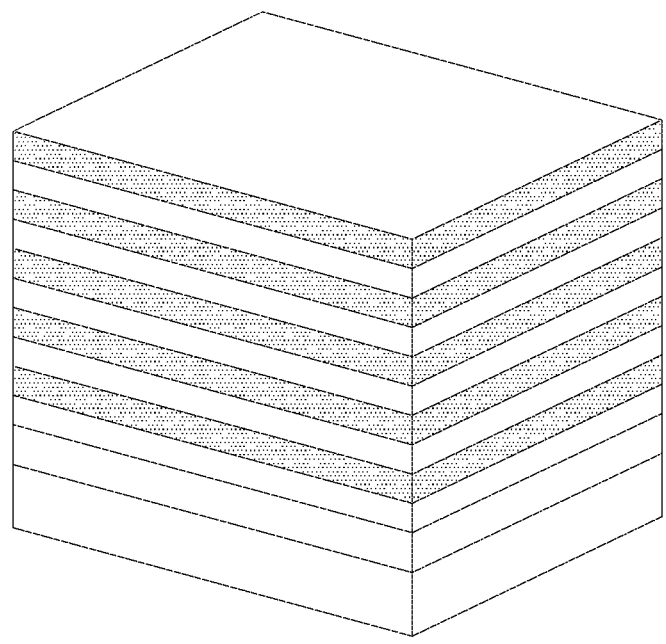
FIG. 1 is a schematic perspective view of a base structure disposed on a substrate and an underlying circuit.
Figure 2:
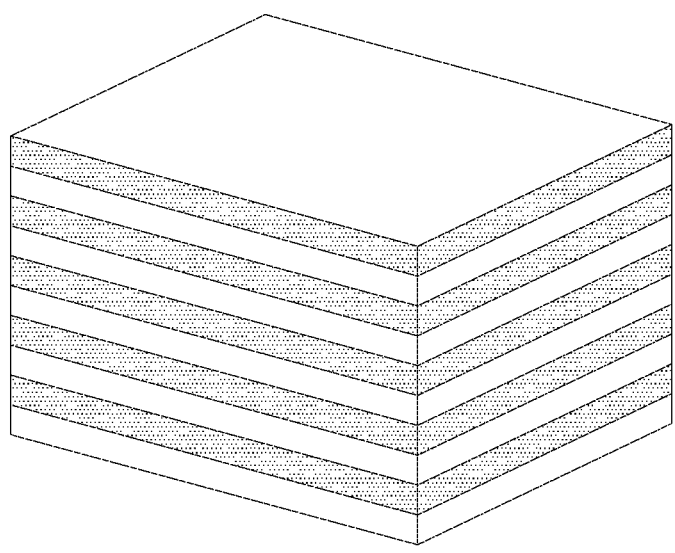
FIG. 2 is a schematic perspective view of a base structure.
Figure 3:
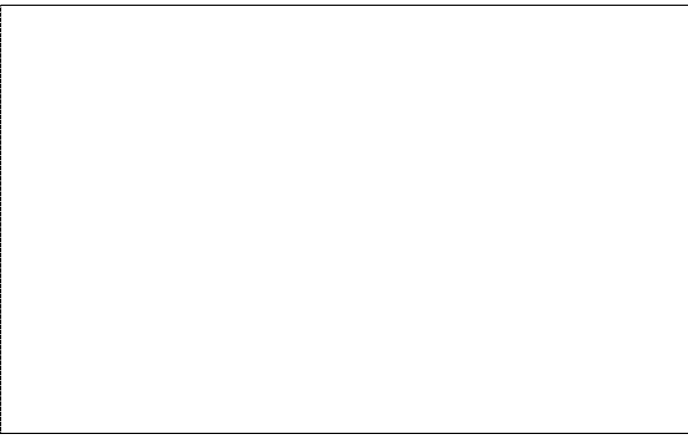
FIG. 3 is a schematic top view of a prototype structure of the present disclosure.
Figure 4:
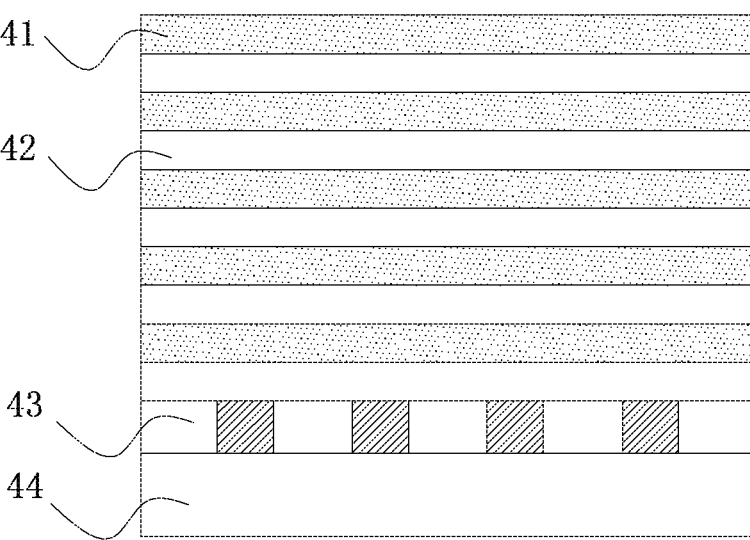
FIG. 4 is a schematic front view of a prototype structure of the present disclosure.

A method for manufacturing a high-density three-dimensional programmable memory includes steps 1-6:

Step 1: a base structure is formed. A predetermined number of conductive medium layers and a predetermined number of insulating medium layers are disposed in such a manner that the conductive medium layers and the insulating medium layers are alternately stacked on each other, to form the base structure, as shown in FIG. 1 to FIG. 4. In an actual process, the base structure is disposed on a substrate and an underlying circuit, as shown in FIG. 1 and FIG. 4. In FIG. 4, 41 is a conductive medium layer and 42 is an insulating medium layer; or 42 is the conductive medium layer and 41 is the insulating medium layer, 43 is the underlying circuit, and 44 is the substrate.

Figure 5:
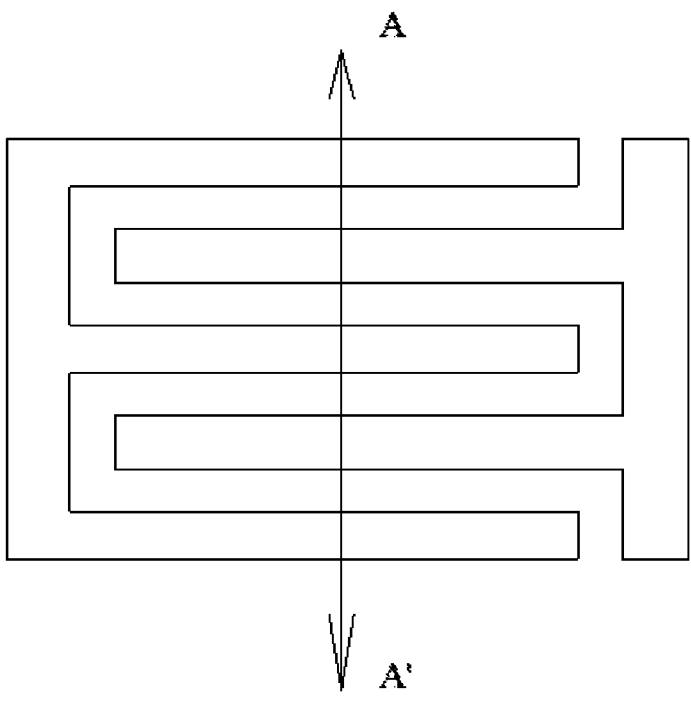
FIG. 5 is a schematic top view of a prototype structure obtained after step 2 of the present disclosure.
Figure 6:
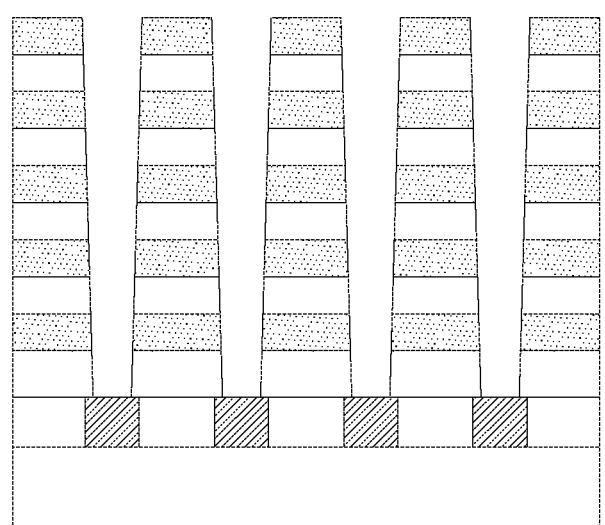
FIG. 6 is a schematic cross-sectional view of a prototype structure obtained after step 2 along an A-A' direction.

Step 2: the base structure is grooved. The base structure is grooved to form a curved division groove penetrating from a top layer to a bottom layer on the base structure, so that the division groove divides the base structure into two interdigitated structures that are staggered and separated from each other, as shown in FIG. 5 and FIG. 6. FIG. 6 is a schematic cross-sectional view of FIG. 5 along an A-A' direction.

Figures 7, 8:
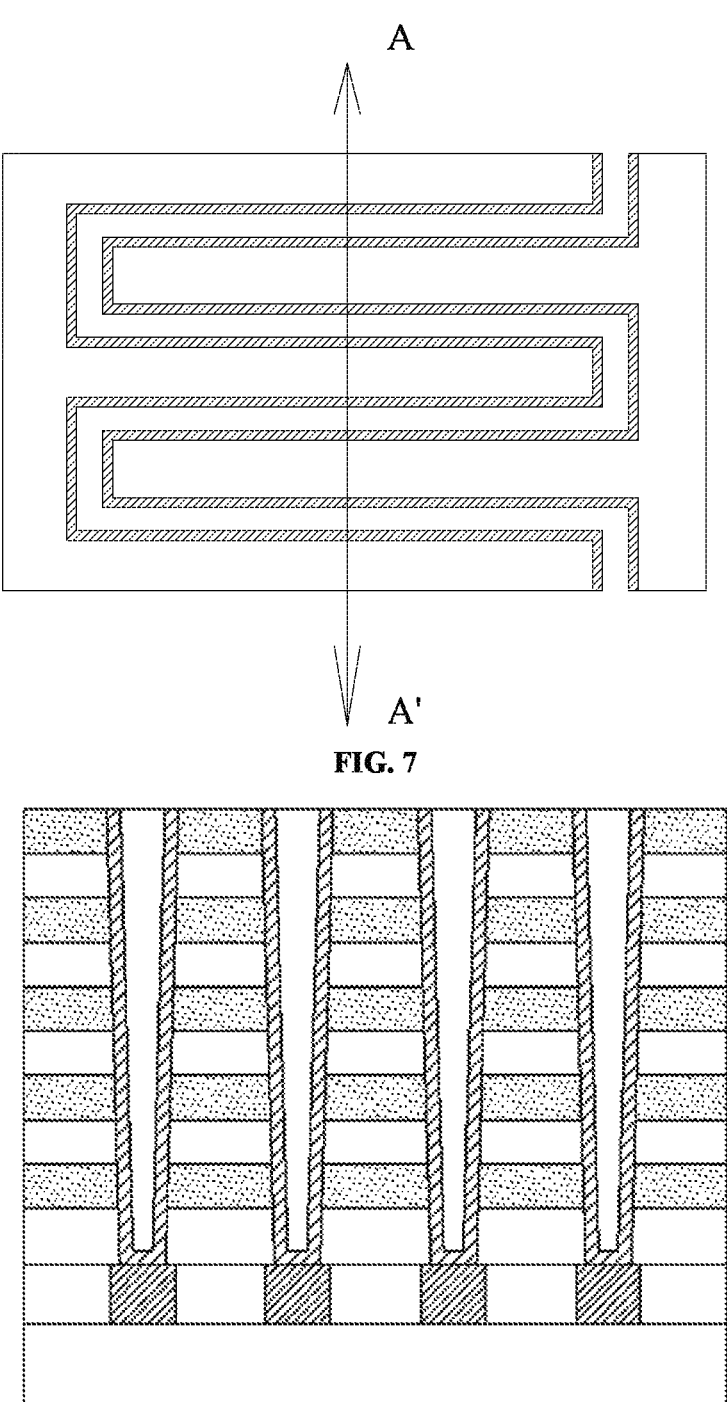
FIG. 7 is a schematic top view of a prototype structure obtained after step 3 of the present disclosure.
FIG. 8 is a schematic cross-sectional view of a prototype structure obtained after step 3 along an A-A' direction.

Step 3: storage medium layers required for a preset memory structure are disposed layer by layer on an inner wall of the division groove, as shown in FIG. 7 and FIG. 8. In the step, a bottom storage medium region is formed in a bottom region of the division groove after deposition via a deposition process, and the bottom storage medium region insulates a core medium in the subsequent step from the underlying circuit. Therefore, a "penetration" step is required to form conductive connection between a core medium layer and the underlying circuit.

Figure 9:
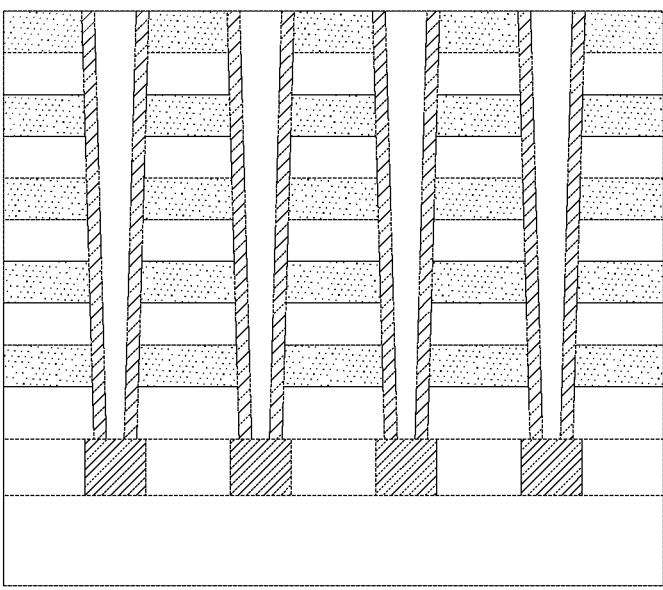
FIG. 9 is a schematic cross-sectional view of a prototype structure processed through etching penetration along an A-A' direction.

As a first penetration method, after step 3 and before step 4, a penetration step may etch the storage medium region in the bottom region to form through holes (referring to FIG. 9), so that the core medium filled in step 4 can be in direct contact with the underlying circuit. Alternatively, after step 6, electricity is applied to the core medium and the underlying circuit, to break down the bottom storage medium region, to form a conductive connection, that is, a second penetration method.

Figure 10:
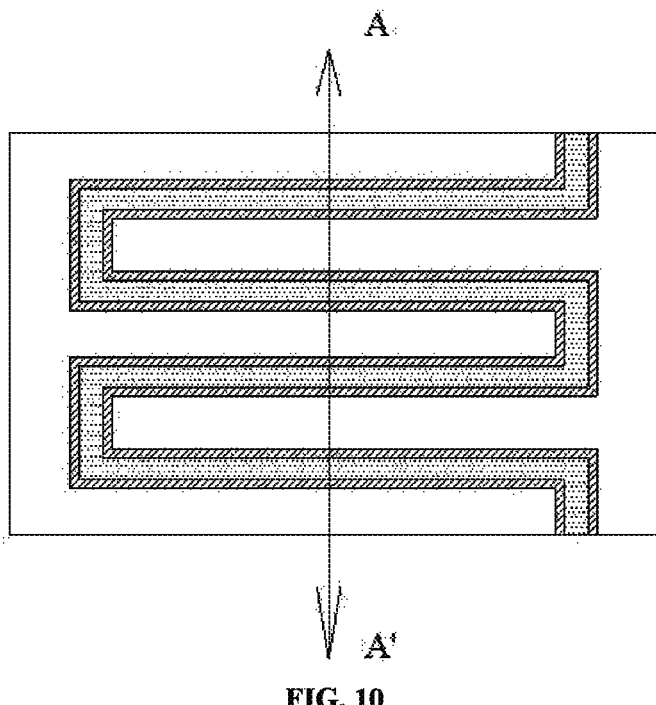
FIG. 10 is a schematic top view of a prototype structure obtained after step 4.
Figure 11:
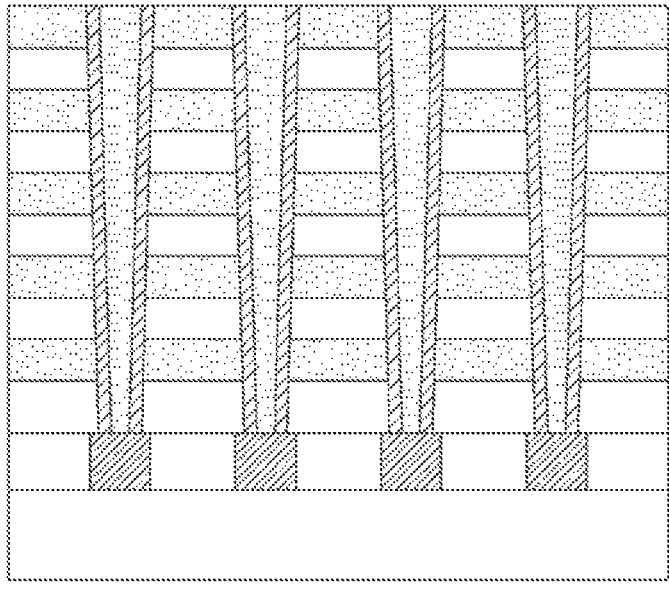
FIG. 11 is a schematic cross-sectional view of a prototype structure obtained after step 4 along an A-A' direction.

Step 4: the core medium is filled in the division groove to form the core medium layer, as shown in FIG. 10 and FIG. 11.

Figure 12:
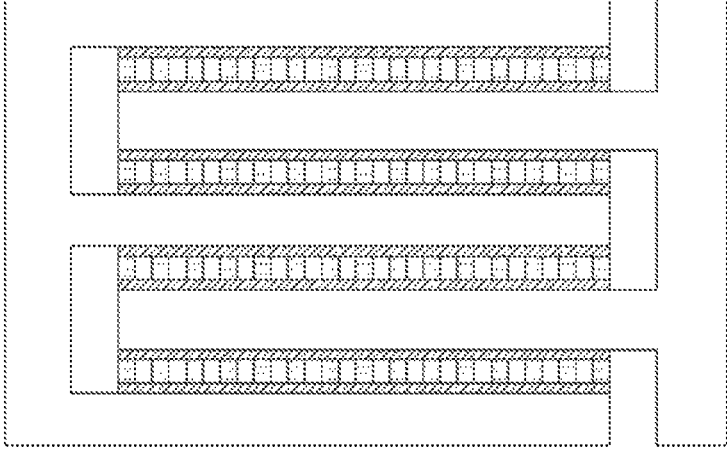
FIG. 12 is a schematic top view of a prototype structure obtained after step 5.

Step 5: through a mask etching process, deep holes are etched along the division groove filled with the core medium, where the deep holes truncate the core medium and the storage medium in the division groove, to form multiple core medium blocks that are distributed along the long-side direction of the division groove and that are independent of each other, and each core medium block is still connected to the two interdigitated structures through the storage medium layer, as shown in FIG. 12.

Figures 13, 14:
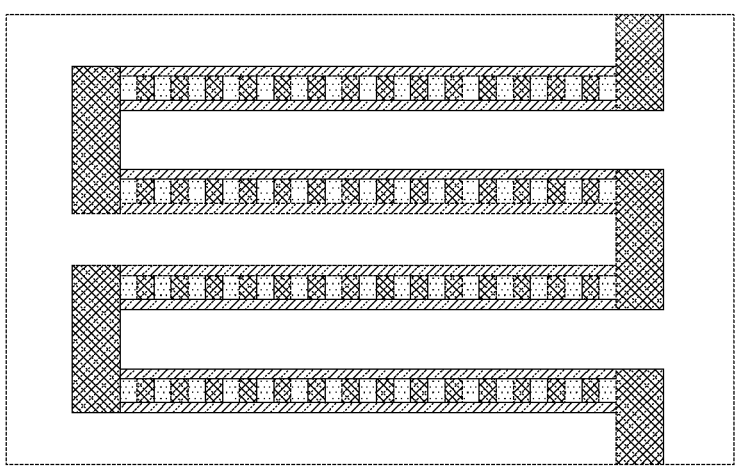
FIG. 13 is a schematic top view of a prototype structure obtained after step 6.
FIG. 14 is a schematic structure diagram of a memory of a first embodiment.

Step 6: an insulating medium is filled in the deep holes etched in step 5, as shown in FIG. 13.

In step 3, the preset memory structure is one of the following structures:

a PN junction semiconductor memory structure, a Schottky semiconductor memory structure, a resistance change memory structure, a magnetic phase change memory structure, a phase change memory structure, and a ferroelectric memory structure.

Figure 15:
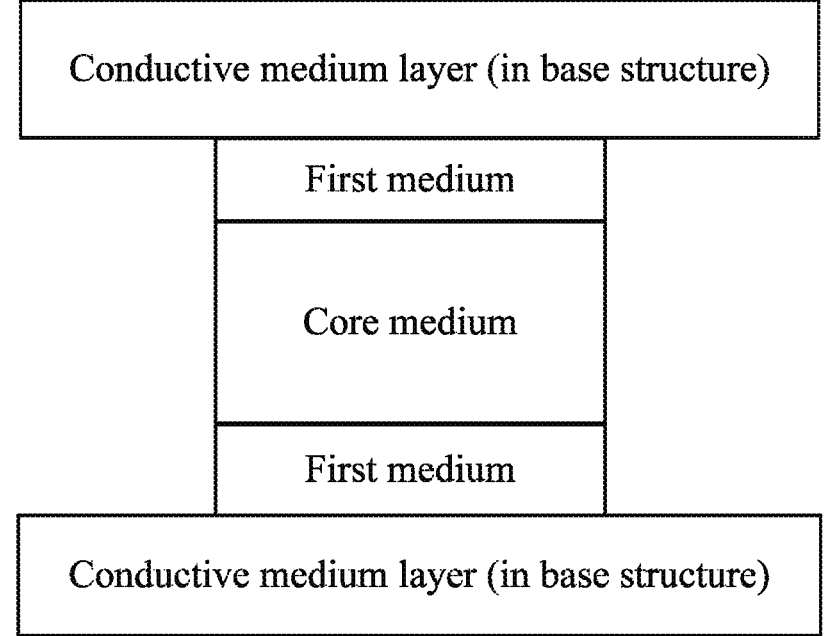
FIG. 15 is a schematic structure diagram of a memory of a second embodiment.

A PN junction semiconductor memory structure shown in FIG. 15 is used as an example, and includes a P-type conductive region, an N-type conductive region, and an insulating medium region disposed therebetween. In the present disclosure, storage medium layers are grown layer by layer in the order of "P-type conductive region-insulating medium region-N-type conductive region". When the conductive medium layer of the base structure is made of a P-type conductive material, there is no need to provide a P-type semiconductor again, and the core medium is an N-type semiconductor. In the manufacturing process of this embodiment, the storage medium layer in step 3 is the insulating medium layer, as shown in FIG. 15.

Various storage medium layers disposed in the division groove may be a part of structure layers forming the memory, or may be all structure layers forming the memory, which depends on a type of a material of the conductive medium layer in the base structure and that of a material of the core medium layer. For example, if the conductive medium layer of the base structure is made of a P-type material, the inner wall of the division groove can be provided only with an insulating medium layer and an N-type material. If the material of the conductive medium layer and the material of the core medium layer are both conductors, all structure layers of the memory need to be deposited layer by layer on the wall of the groove, and the conductive medium layer and the core medium layer are only used as lead wires.

First implementation: there are three layers of medium in the division groove.

This implementation includes steps 1 to 6:

Step 1: a base structure is formed on the substrate and the underlying circuit. A predetermined number of conductive medium layers (made of a material of a low-resistance semiconductor or conductor) and a predetermined number of insulating medium layers are disposed in such a manner that the conductive medium layers and the insulating medium layers are alternately stacked on each other (for example, a deposition process is used), to form the base.

Step 2: the base structure is grooved: a division groove is etched on the base structure using a mask definition and a deep well etching process, to divide the base structure into two interdigitated structures that are staggered and separated from each other.

Step 3: a first medium layer 101 is deposited on an inner wall of the division groove using an atomic layer deposition (ALD) process; and then a second medium layer 102 is deposited on a surface of the first medium layer 101 using the ALD process.

Step 4: a core medium is filled in the cavity of the division groove provided with the first medium layer and the second medium layer to form a core medium layer.

Step 5: through a mask etching process, deep holes are etched along the division groove filled with the core medium, where the deep holes truncate the core medium and the storage medium in the division groove, to form multiple core medium blocks that are distributed along the long-side direction of the division groove and that are independent of each other, which are referred to as a core medium block sequence, and each core medium block is still connected to the two interdigitated structures through the storage medium layer.

Step 6: an insulating medium material is filled in the deep hole.

In this implementation, the storage medium layer includes a first medium layer and a second medium layer, where involved mediums can be combined as shown in Table 1 below. Each combination indicates an embodiment. FIG. 14 is a schematic structure diagram of this implementation.

TABLE 1

| | Base structure Conductive medium | First medium layer | Second medium layer | Core medium layer |
|---|---|---|---|---|
| Embodiment 1 | P+-type semiconductor | insulating medium | lightly-doped N-type semiconductor | N+-type semiconductor or conductor |
| Embodiment 2 | N+-type semiconductor or conductor | insulating medium | lightly-doped P-type semiconductor | P+-type semiconductor |
| Embodiment 3 | P-type Schottky metal | insulating medium | lightly-doped N-type semiconductor | N+-type semiconductor or conductor |
| Embodiment 4 | N-type Schottky metal | insulating medium | lightly-doped p-type semiconductor | P+-type semiconductor or conductor |

A thickness of the insulating medium in the above table is preferably 0.5 nm to 5 nm. The first medium layer and the second medium layer are both storage medium layers.

In the present disclosure, interdigitated structures including interdigitated strips and common connecting strips are formed, the two interdigitated structures intersect with each other, a plurality of independent memory units isolated by insulators are present between interdigitated strips, and insulators are the insulating medium filled in the division groove. In each layer of the base structure, each memory unit includes two memory cells. As shown in FIG. 14, the memory cell includes a first medium—a second medium—a core medium, and the material of each layer satisfies the requirement of the PN junction or the Schottky structure.

Second implementation: there are two layers of mediums in the division groove.

What this implementation differs from the first implementation lies in that the division groove is provided only with two layers of mediums, that is, a first medium and a core medium.

FIG. 10 is a schematic diagram of a memory manufactured based on the process of this implementation. FIG. 11 is an enlarged schematic diagram of a single memory unit.

Mediums involved may be combined as shown in Table 2 below. A first medium layer in the table is a storage medium layer. Each combination indicates an embodiment. The structure is shown in FIG. 15.

TABLE 2

| | Base structure Conductive medium layer | First medium layer | Core medium layer |
|---|---|---|---|
| Embodiment 5 | P-type semiconductor | insulating medium | N-type semiconductor |
| Embodiment 6 | N-type semiconductor | insulating medium | P-type semiconductor |
| Embodiment 7 | Schottky metal | insulating medium | semiconductor |
| Embodiment 8 | semiconductor | insulating medium | Schottky metal |
| Embodiment 9 | conductor | memory medium | conductor |

The memory medium is a resistance change memory, a magnetic phase change memory, a phase change memory, or a ferroelectric memory.

In the present disclosure, the medium layers other than the core medium layer in the division groove of the base structure are collectively referred to as "storage medium layers", for example, the first medium layer (insulating layer) in Table 1, the second medium layer in Table 1 (buffer layer), and the first medium layer in Table 2. In the present disclosure, the above layers are all referred to as storage medium layers.

The process steps of the present disclosure are very concise and can be summarized to include:

(1) grooving the base structure to form the interdigitated structures;

(2) disposing the storage medium layer on the inner wall of the groove;

(3) filling the core medium;

(4) dividing the core medium; and (5) filling the insulating medium.

Figure 16:
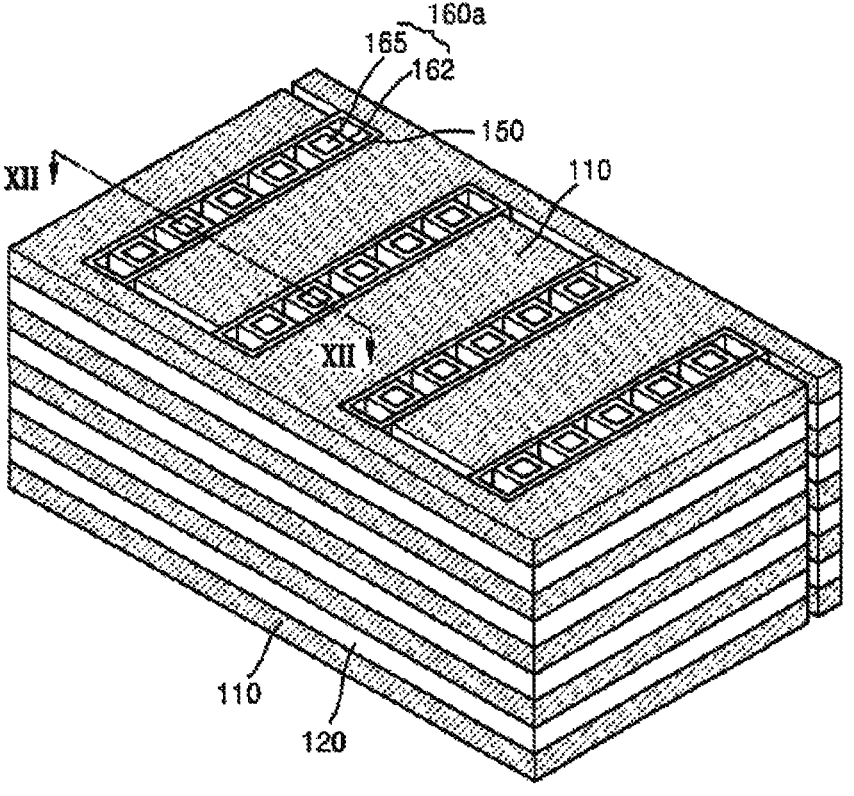
FIG. 16 is FIG. 11 of a disclosure of Chinese Patent No. 201910136928.1.

FIG. 16 of the present disclosure is FIG. 11 of Chinese patent application No. 201910136928.1. As can be seen from the structure, at least the following steps are required:

(1) grooving abase structure to form interdigitated structures;

(2) filling an insulating medium in the groove;

(3) grooving the filled insulating medium for the second time;

(4) disposing a data storage layer 150 on an inner wall of the groove formed in step 3;

(5) filling the insulating medium again;

(6) deep hole etching; and (7) disposing electrodes 162 and 165 in the deep hole.

Obviously, the process of the present disclosure is greatly simplified.

What is claimed is:

1. A method for manufacturing a high-density three-dimensional programmable memory, comprising:

step 1: forming a base structure, wherein a predetermined number of conductive medium layers and a predetermined number of insulating medium layers are disposed in such a manner that the conductive medium layers and the insulating medium layers are alternately stacked on each other to form the base structure, wherein an underlying circuit and the base structure are stacked in sequence on a substrate;

step 2: grooving the base structure, wherein the base structure is grooved to form a curved division groove penetrating from a top layer to a bottom layer of the base structure, so that the division groove divides the base structure into two interdigitated structures that are staggered and separated from each other;

step 3: depositing a storage medium layer required by a preset memory structure layer by layer on an inner wall of the division groove;

step 4: filling a core medium in the division groove to form a core medium layer; wherein the core medium is a semiconductor or a conductor;

step 5: etching, through a mask etching process, to form deep holes along the division groove filled with the core medium, wherein the deep holes truncate the core medium in the division groove, to form a predetermined number of core medium blocks that are distributed along a long-side direction of the division groove and that are independent of each other, and each core medium block is connected to the two interdigitated structures through the storage medium layer; and step 6: filling only an insulating medium in the deep holes formed by etching in step 5;

wherein the method further comprises a step of penetrating through a part that is formed only on the underlying circuit and not on opposite side walls of the inner wall during the depositing of the storage medium layer on the inner wall of the division groove after performing step 3 or after performing step 6.

2. The method for manufacturing the high-density three-dimensional programmable memory according to claim 1, wherein in step 3, the preset memory structure is one of the following structures:

a PN junction semiconductor memory structure, a Schottky semiconductor memory structure, a resistance change memory structure, a magnetic phase change memory structure, a phase change memory structure, and a ferroelectric memory structure.

3. The method for manufacturing the high-density three-dimensional programmable memory according to claim 1, wherein the preset memory structure is a PN junction semiconductor memory structure, comprising a P-type conductive region, an N-type conductive region, and an insulating medium region disposed therebetween;

wherein the conductive medium layer is a P-type semiconductor, and the core medium layer is an N-type semiconductor; or the conductive medium layer is an N-type semiconductor, and the core medium layer is a P-type semiconductor; and wherein step 3 comprises:

step 3.1: depositing an insulating layer in the division groove as the storage medium layer.

4. The method for manufacturing the high-density three-dimensional programmable memory according to claim 1, wherein the preset memory structure is a Schottky diode memory structure, comprising a semiconductor conductive region, a metal conductive region, and an insulating medium region disposed therebetween;

wherein the conductive medium layer is a semiconductor required for forming a Schottky diode structure, and the core medium layer is metal required for forming the Schottky diode structure; or the conductive medium layer is metal required for forming the Schottky diode structure, and the core medium layer is a semiconductor required for forming the Schottky diode structure; and wherein step 3 comprises:

step 3.1: depositing an insulating layer in the division groove as the storage medium layer.

5. The method for manufacturing the high-density three-dimensional programmable memory according to claim 1, wherein the preset memory structure is a memory-medium memory structure, and the memory-medium memory is any one of a resistance change memory structure, a magnetic phase change memory structure, a phase change memory structure, and a ferroelectric memory structure;

wherein materials of the conductive medium layer and the core medium layer are both metal or polycrystalline silicon; and wherein step 3 comprises:

step 3.1: depositing a memory medium layer in the division groove as the storage medium layer.

6. The method for manufacturing the high-density three-dimensional programmable memory according to claim 1, wherein the preset memory structure is a PN junction semiconductor memory structure, comprising a P-type conductive region, an N-type conductive region, and an insulating medium region disposed therebetween;

wherein the conductive medium layer is a P+-type semiconductor, and the core medium layer is an N+-type semiconductor or conductor; and the storage medium layer comprises a first medium layer and a second medium layer;

wherein step 3 comprises:

step 3.1: depositing an insulating layer in the division groove, as the first medium layer; and step 3.2: depositing a lightly-doped N-type semiconductor layer on an inner wall of the insulating layer, as the second medium layer; and wherein step 4 comprises filling the core medium in a cavity of the division groove provided with the first medium layer and the second medium layer.

7. The method for manufacturing the high-density three-dimensional programmable memory according to claim 1, wherein the preset memory structure is a PN junction semiconductor memory structure, comprising a P-type conductive region, an N-type conductive region, and an insulating medium region disposed therebetween;

wherein the conductive medium layer is an N+-type semiconductor or conductor, and the core medium layer is a P+-type semiconductor; and the storage medium layer comprises a first medium layer and a second medium layer;

wherein step 3 comprises:

step 3.1: depositing a lightly-doped N-type semiconductor layer in the division groove, as the first medium layer; and step 3.2: depositing an insulating layer on an inner wall of the lightly-doped N-type semiconductor layer, as the second medium layer; and wherein step 4 comprises filling the core medium in a cavity of the division groove provided with the first medium layer and the second medium layer.

8. The method for manufacturing the high-density three-dimensional programmable memory according to claim 1, wherein the preset memory structure is a Schottky semiconductor memory structure, comprising a metal conductive region, a semiconductor conductive region, and an insulating medium region disposed therebetween; and the storage medium layer comprises a first medium layer and a second medium layer;

wherein step 3 comprises:

step 3.1: depositing an insulating layer in the division groove, as the first medium layer; and step 3.2: depositing a semiconductor layer on an inner wall of the insulating layer, as the second medium layer;

wherein step 4 comprises filling the core medium in a cavity of the division groove provided with the first medium layer and the second medium layer; and wherein the conductive medium layer is metal required for a Schottky diode, the semiconductor layer is a semiconductor required for a Schottky diode, and the core medium layer is a conductor.

9. The method for manufacturing the high-density three-dimensional programmable memory according to claim 1, wherein the step of penetrating through the part that is formed only on the underlying circuit and not on opposite side walls of the inner wall during the depositing of the storage medium layer on the inner wall after performing step 3 or after performing step 6 comprises:

after performing step 3, etching the part until the part only formed on the underlying circuit is penetrated through; or after performing step 6, applying power to the filled core medium and the underlying circuit, to break down the part.

* * * * *